(12) United States Patent
Chen et al.

(10) Patent No.: US 9,818,859 B2
(45) Date of Patent: Nov. 14, 2017

(54) QUASI-VERTICAL POWER MOSFET AND METHODS OF FORMING THE SAME

(75) Inventors: Chi-Chih Chen, Hsin-Chu (TW); Kun-Hsuan Tien, Tainan (TW); Ruey-Hsin Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 70 days.

(21) Appl. No.: 13/219,283

(22) Filed: Aug. 26, 2011

(65) Prior Publication Data

US 2013/0049108 A1 Feb. 28, 2013

(51) Int. Cl.
| | | |
|---|---|---|
| *H01L 29/78* | (2006.01) | |
| *H01L 21/336* | (2006.01) | |
| *H01L 29/66* | (2006.01) | |
| H01L 29/417 | (2006.01) | |
| H01L 29/423 | (2006.01) | |
| H01L 29/08 | (2006.01) | |

(52) U.S. Cl.
CPC .... *H01L 29/7809* (2013.01); *H01L 29/66734* (2013.01); *H01L 29/0878* (2013.01); *H01L 29/41766* (2013.01); *H01L 29/41775* (2013.01); *H01L 29/42368* (2013.01); *H01L 29/42376* (2013.01)

(58) Field of Classification Search
CPC ............. H01L 29/7835; H01L 29/0847; H01L 29/7833; H01L 29/66681; H01L 29/7816; H01L 29/0653; H01L 29/66659; H01L 21/823418; H01L 21/823814; H01L 27/11524; H01L 29/41758; H01L 29/4236; H01L 29/41775; H01L 29/4234; H01L 29/42392; H01L 29/41766

USPC .......... 257/328–333, 288, 401, 901, 335–338

See application file for complete search history.

(56) References Cited

U.S. PATENT DOCUMENTS

| | | | | |
|---|---|---|---|---|
| 4,914,058 | A * | 4/1990 | Blanchard | 438/270 |
| 5,122,848 | A * | 6/1992 | Lee | H01L 27/10864 257/265 |
| 6,316,807 | B1 * | 11/2001 | Fujishima | H01L 29/7834 257/333 |
| 7,005,352 | B2 * | 2/2006 | Fujishima et al. | 257/E21.41 |
| 7,034,377 | B2 * | 4/2006 | Sugi | H01L 29/7825 257/335 |
| 2009/0095999 | A1 * | 4/2009 | Jang | H01L 29/0653 257/301 |
| 2009/0140343 | A1 * | 6/2009 | Feilchenfeld | H01L 29/407 257/367 |
| 2009/0283823 | A1 * | 11/2009 | Izumi | 257/332 |
| 2013/0187224 | A1 * | 7/2013 | Verma | H01L 21/823814 257/337 |

* cited by examiner

Primary Examiner — Marc Armand
Assistant Examiner — Quinton Brasfield
(74) Attorney, Agent, or Firm — Slater Matsil, LLP

(57) ABSTRACT

A MOSFET includes a semiconductor substrate having a top surface, a body region of a first conductivity type in the semiconductor substrate, and a double diffused drain (DDD) region having a top surface lower than a bottom surface of the body region. The DDD region is of a second conductivity type opposite the first conductivity type. The MOSFET further includes a gate oxide, and a gate electrode separated from the body region by the gate oxide. A portion of the gate oxide and a portion of the gate electrode are below the top surface of the body region.

20 Claims, 15 Drawing Sheets

QUASI-VERTICAL POWER MOSFET AND METHODS OF FORMING THE SAME

BACKGROUND

Lateral diffused metal-oxide-semiconductor (LDMOS) devices are widely used in power management applications for their excellent performance in breakdown voltage BVdss and on-resistance Ron. A conventional LDMOS device may include a well region, and a gate stack including a gate dielectric and a gate electrode over the well region. A body region and a double diffused drain (DDD) region extend to under the gate stack, and are spaced apart by a portion of a well region that is directly under the gate stack. A source pickup region and a drain pickup region are disposed on opposite sides of the gate stack, and are formed over the body region and the DDD region, respectively.

The cell pitch of the LDMOS is determined by the lateral sizes of the gate stack, the body region, the DDD region, and the like. To obtain the desirable breakdown voltage BVdss, the cell pitch of the LDMOS generally cannot be smaller than certain value, and hence on-resistance Ron is sacrificed. Accordingly, the down scaling of the gate density of the LDMOS devices is limited.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 13A are cross-sectional views of intermediate stages in the manufacturing of an n-type power metal-oxide-semiconductor field-effect transistor (MOSFET) in accordance with various embodiments.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A power metal-oxide-semiconductor field-effect transistor (MOSFET) and the method of forming the same are provided in accordance with various embodiments. The intermediate stages of forming a power MOSFET are illustrated. The variations of the embodiments are discussed. Throughout the various views and illustrative embodiments, like reference numbers are used to designate like elements.

Figure 1:
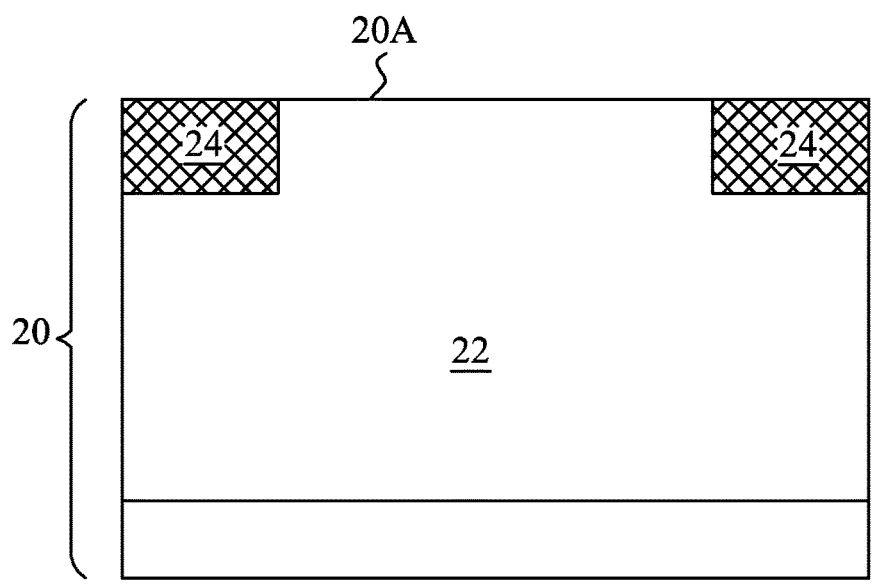

FIGS. 1 through 13A are cross-sectional views of intermediate stages in the formation of an n-type power MOSFET. Referring to FIG. 1, semiconductor substrate 20 is provided. Semiconductor substrate 20 may be a crystalline silicon substrate. Alternatively, semiconductor substrate 20 may be formed of other semiconductor materials such as silicon germanium. Furthermore, semiconductor substrate 20 may be a bulk substrate. Semiconductor substrate 20 may be lightly doped with a p-type impurity such as boron or indium. In an embodiment, n-well region 22 is formed in substrate 20, and may extend from top surface 20A of semiconductor substrate 20 into semiconductor substrate 20. Shallow trench isolation (STI) regions 24 may also extend from top surface 20A of semiconductor substrate 20 into semiconductor substrate 20.

Figure 2:
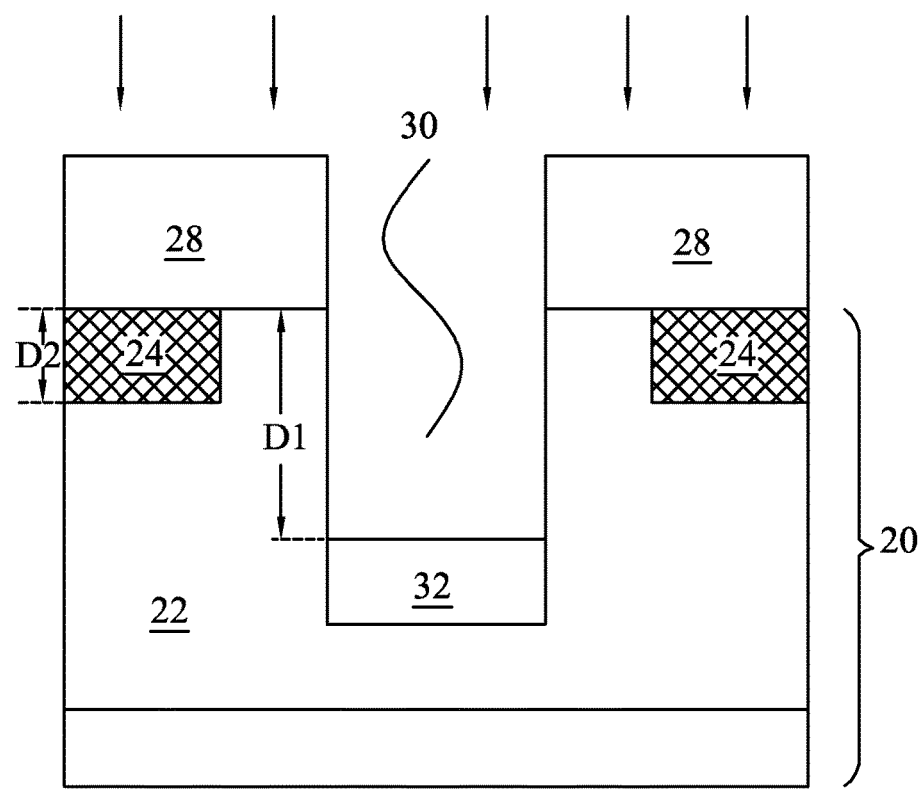

Referring to FIG. 2, mask 28 is formed and patterned. In an embodiment, mask 28 is formed of silicon nitride. Well region 22 is then etched to form trench 30 using mask 28 as the etch mask. In an embodiment, depth D1 of trench 30 is greater than about 1 µm. Depth D1 may also be greater than depth D2 of STI regions 24. Next, an implantation, which is shown as arrows, is performed to implant an n-type impurity into trench 30, and a portion of well region 22 under trench 30 is implanted to form double diffused drain (DDD) region 32. In an embodiment, DDD region 32 has an impurity concentration between about $10^{16}/cm^3$ and about $10^{17}/cm^3$.

Figure 3:
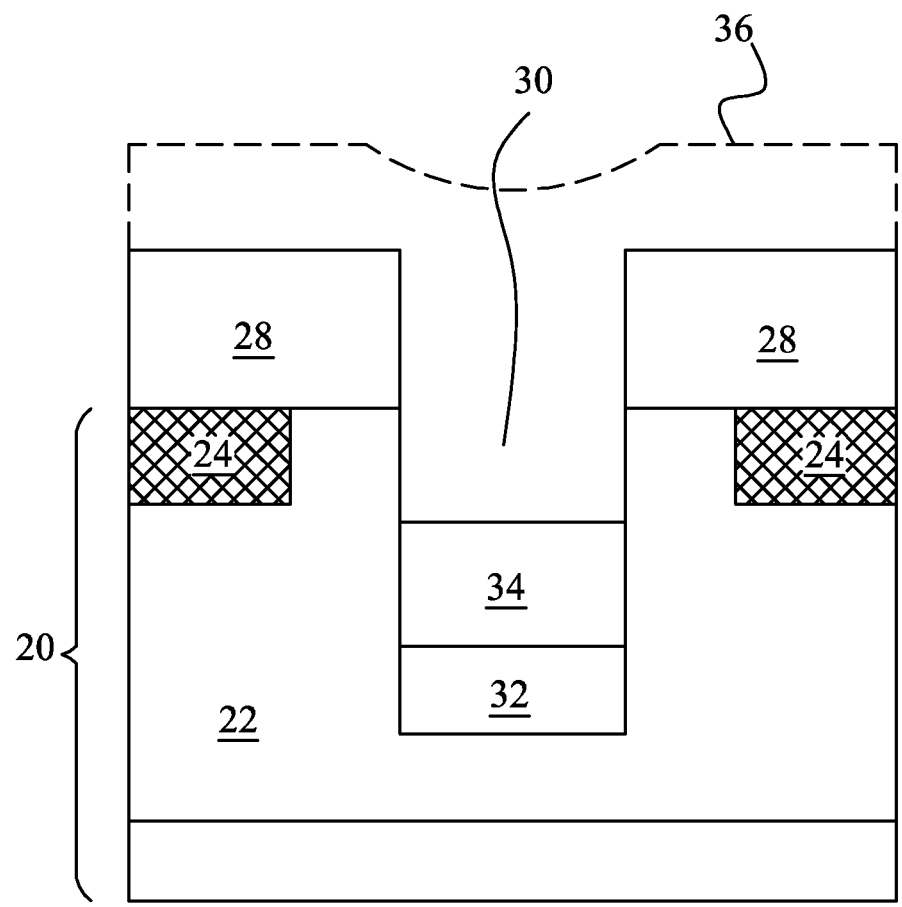

FIG. 3 illustrates the formation of dielectric region 34 in trench 30. Dielectric region 34 may be formed of an oxide such as silicon oxide, and hence is referred to as oxide region 34 hereinafter, although it may be formed of dielectric materials other than oxides. In an exemplary formation process for forming oxide region 34, trench 30 is filled with an oxide, until the top surface (illustrated using dashed line 36) of the oxide is higher than the top surface of mask 28. A planarization such as a chemical mechanical polish (CMP) is then performed to level the top surface of the filled oxide, until the top surface of the oxide is level with the top surface of mask 28. An etch step is then performed to recess the oxide, and the resulting oxide forms oxide region 34.

Figure 4:
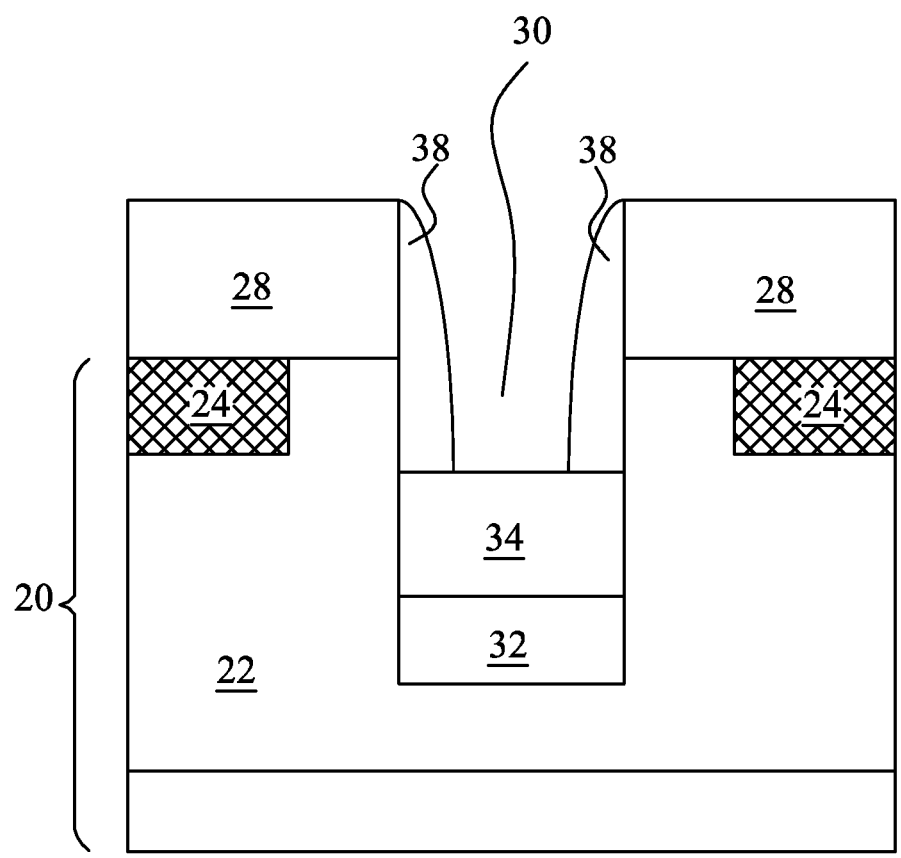
Figure 5:
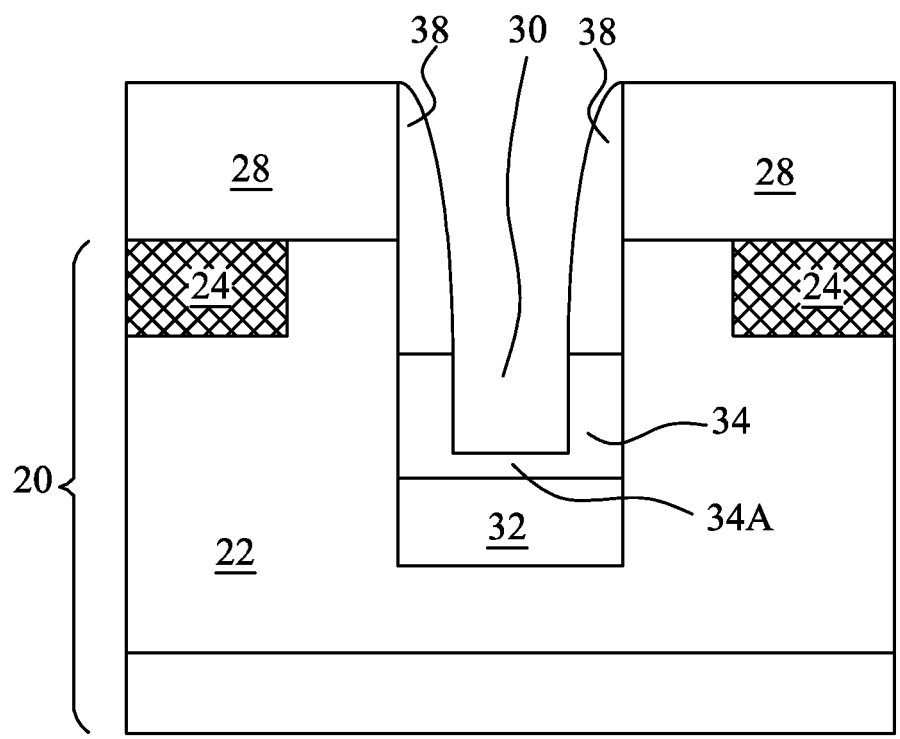

Referring to FIG. 4, spacers 38 are formed. The formation of spacers 38 may include forming a blanket spacer layer, and then performing an etching step to remove the horizontal portions of the spacer layer, while the vertical portions of the spacer layer are left on the sidewalls of trench 30 to form spacers 38. The vertical portions of the spacer layer form spacers 38. Spacers 38 may be formed using a material that is the same as the material of mask 28, such as silicon nitride, although spacers 38 and mask 28 may be formed of different materials. Next, as shown in FIG. 5, spacers 38 are used as masks to recess oxide region 34. After etching oxide region 34, a remaining layer 34A is left at the bottom of trench 30. In an embodiment, the etching is an anisotropic etching performed using a dry etch method, although a wet etching method may also be used.

Figure 6:
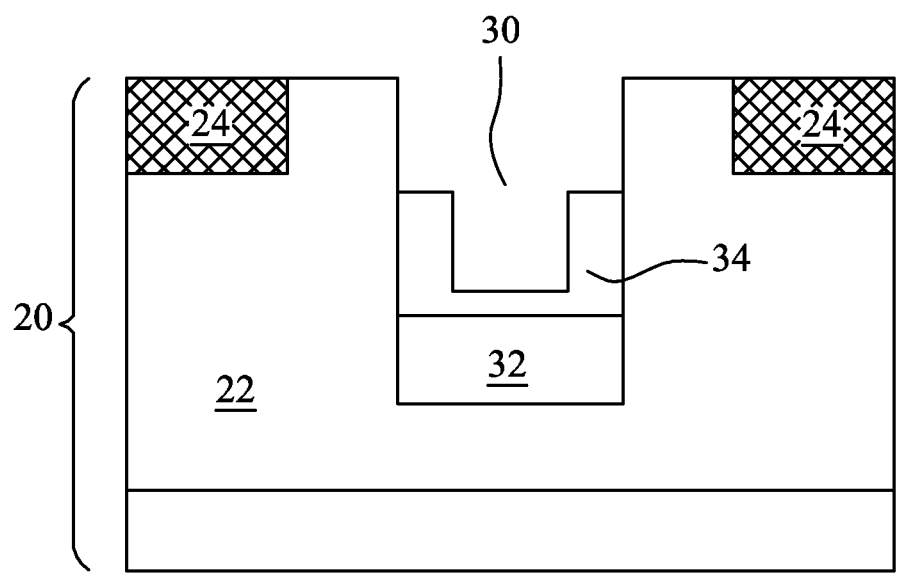
Figure 7:
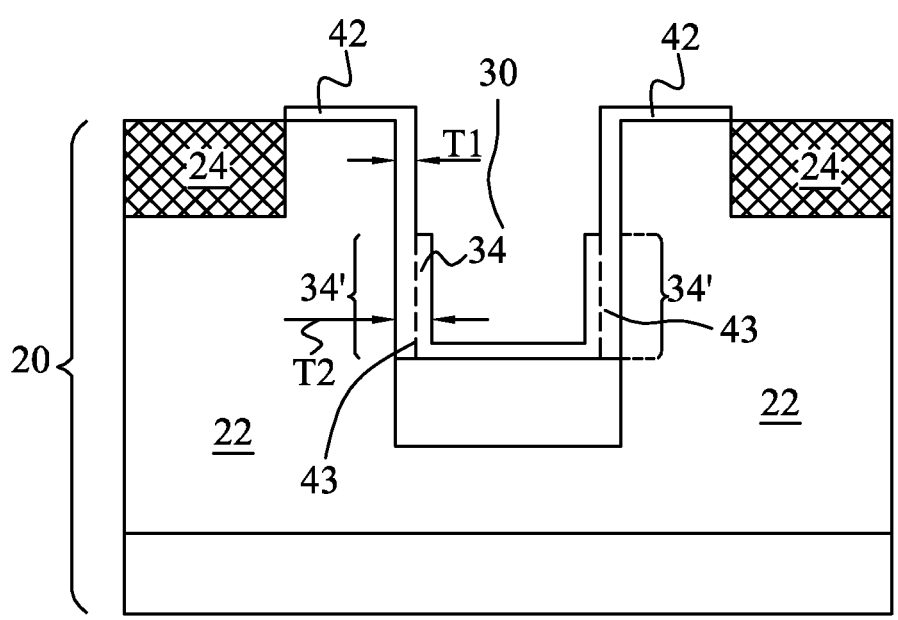

FIG. 6 illustrates the removal of spacers 38 and mask 28, wherein the etchant of the etching may comprise the solution of $H_3PO_4$, for example. In addition, any pad oxide (not shown) that is under mask 28 is also removed. The surface of semiconductor substrate 20 is then exposed, wherein the exposed surface includes a portion facing trench 30. Next, as shown in FIG. 7, a thermal oxidation is performed to form oxide layer 42 on the surface of substrate 20/well region 22. Oxide layer 42 includes horizontal portions outside trench 30, and vertical portions that are inside trench 30. As a result of the thermal oxidation, oxide layer 42 may include a first portion that is in the upper part of trench 30, wherein the first portion has a first thickness T1. Oxide layer 42 may further include a second portion contacting the outer sidewall of oxide region 34. Dashed lines 43 schematically illustrate the interface between the second portion of oxide layer 42 and oxide region 34. Throughout the description, reference notation 34' represents a combined region of the second portion of oxide layer 42 and oxide region 34. The sidewall portion of oxide region 34' has thickness T2, which is greater than thickness T1.

Figure 8:
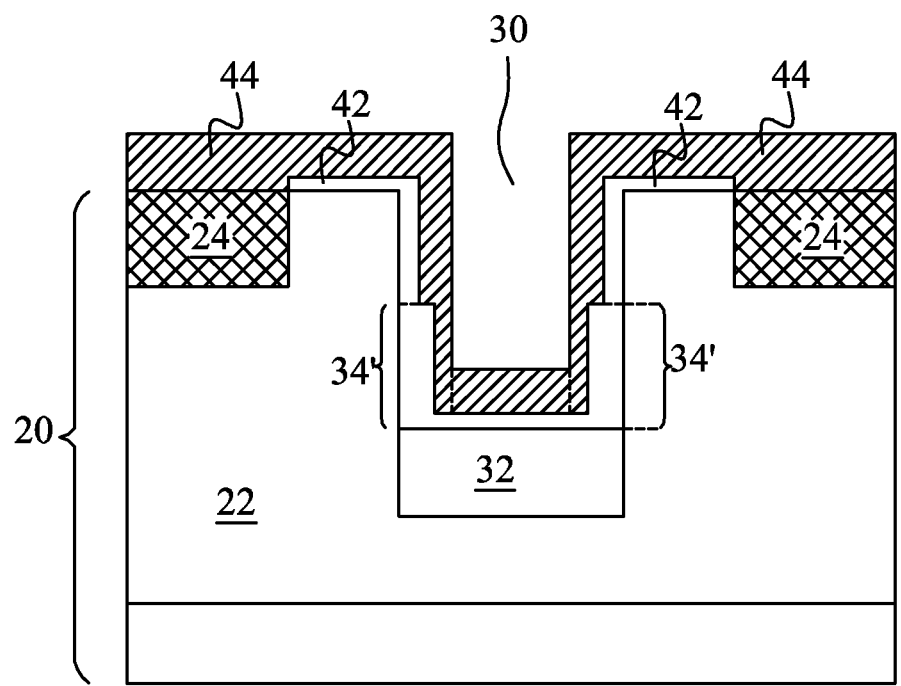

FIG. 8 illustrates the deposition of gate electrode layer 44. In an embodiment, gate electrode layer 44 is a polysilicon layer, which may be in-situ doped with an n-type impurity, for example. In alternative embodiments, gate electrode layer 44 is formed of other conductive materials such as metals, metal silicides, or the like. Gate electrode layer 44 includes horizontal portions over substrate 20, a horizontal portion at the bottom of trench 30, and vertical portions on sidewalls of trench 30.

Figure 9:
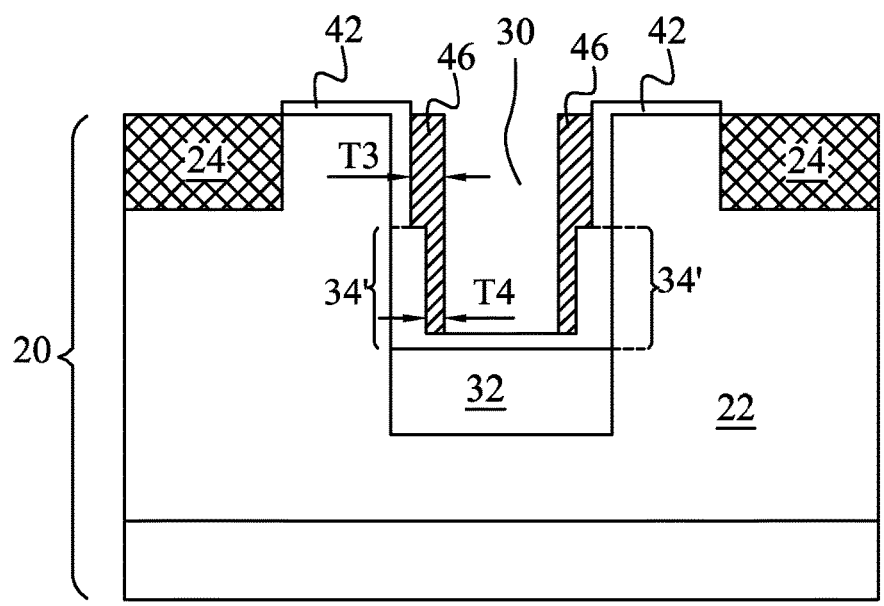

FIG. 9 illustrates the etching performed on gate electrode layer 44, so that horizontal portions of gate electrode layer 44 are removed, while vertical portions of gate electrode layer 44 remain on the sidewalls of oxide regions 34' and gate oxide layer 42. The remaining portions of gate electrode layer 44 form gate electrode 46. In the top view of the structure shown in FIG. 9, gate electrode 46 may form a ring encircling the remaining trench 30. Gate electrode 46 may include a first portion on the vertical portion of oxide layer 42, and a second portion on the sidewall of oxide region 34'. The first portion of gate electrode 46 may have thickness T3 substantially equal to thickness T4 of the second portion.

Figure 10:
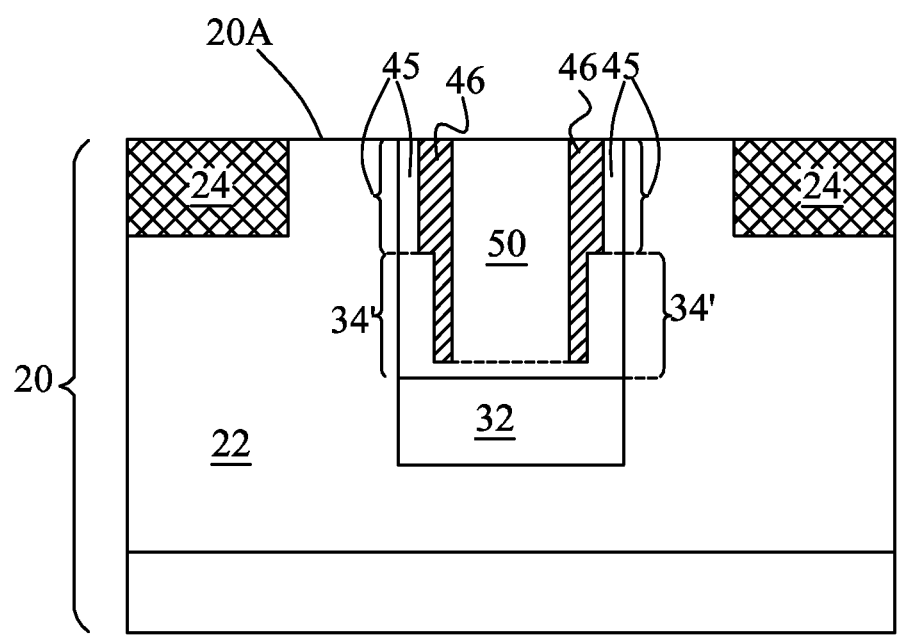

Referring to FIG. 10, dielectric region 50 is formed to fill the remaining trench 30. The formation of dielectric region 50 may include filling a dielectric material into trench 30 to a level higher than top surface 20A of semiconductor substrate 20, and then performing a CMP to remove the excess portion of the dielectric material over top surface 20A. In an embodiment, dielectric region 50 comprises silicon oxide, although it may also be formed of other dielectric materials. In the resulting structure, the horizontal portion of oxide layer 42 is removed, for example, by the CMP, and the remaining vertical portion of oxide layer 42 is referred to gate oxide 45 throughout the description. Gate oxide 45 acts as the gate oxide (gate dielectric) of the resulting power MOSFET 100 (FIG. 13A).

Figure 11:
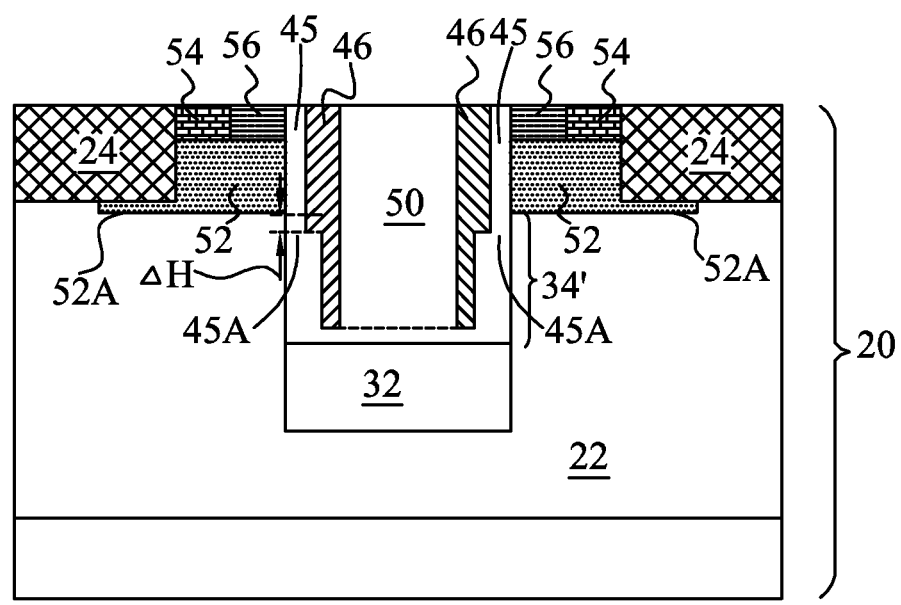

FIG. 11 illustrates the formation of p-body 52, p-body pickup region(s) 54, and source pickup region(s) 56. P-body 52 and p-body pickup region 54 are formed by implanting p-type impurities into well region 22/substrate 20, and source pickup region(s) 56 are formed by implanting an n-type impurity into well region 22/substrate 20. The impurity concentration of p-body 52 is lower than the impurity concentrations of p-body pickup region 54 and source pickup regions 56. In an exemplary embodiment, P-body 52 has an impurity concentration between about $10^{17}/cm^3$ and about $10^{18}/cm^3$. P-body pickup region(s) 54 and source pickup region(s) 56 are heavily doped regions. In the described embodiments, the term "heavily doped" means an impurity concentration of above about $10^{19}/cm^3$. One skilled in the art will recognize, however, that heavily doped is a term of art that depends upon the specific device type, technology generation, minimum feature size, and the like. In an embodiment, the bottom end 45A of gate oxide 45 is lower than the bottom surface 52A of p-body 52 to ensure that the channel is formed above the bottom end of gate oxide 45. Bottom surface 52A may be higher than bottom end 45A by difference ΔH, which may be greater than about 0.1 μm in an exemplary embodiment.

Figure 12:
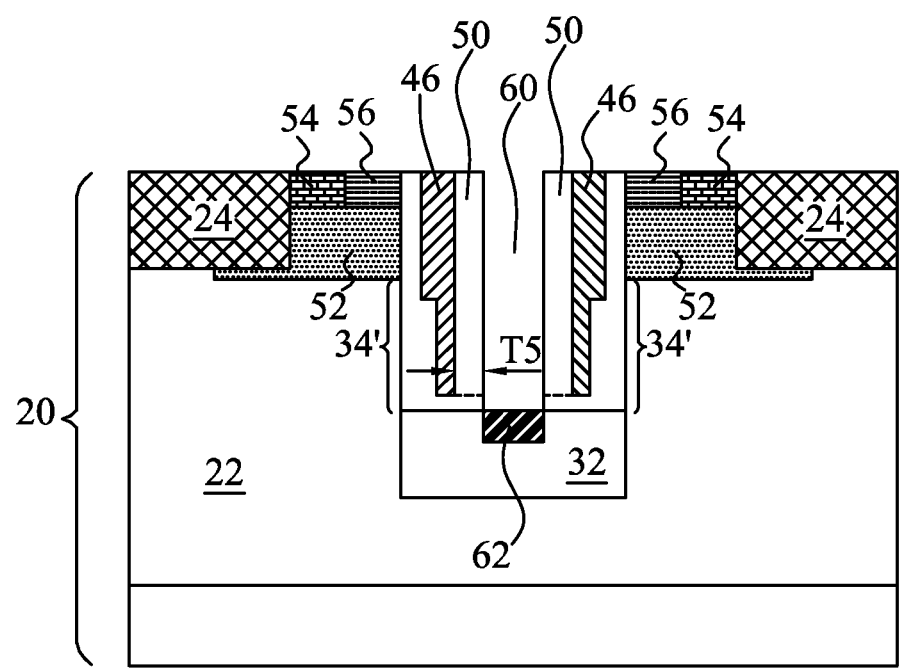

In FIG. 12, dielectric region 50 is recessed to form opening 60 in dielectric region 50 and oxide region 34', wherein DDD region 32 is exposed through opening 60. Gate electrode 46 is spaced apart from opening 60 by remaining dielectric region 50. In an embodiment, thickness T5 of remaining dielectric region 50 is greater than about 0.1 μm. Next, an implantation is performed to the bottom of opening 60 to form drain pickup region 62, wherein drain pickup region 62 may be a heavily doped n-type region. At the time the implantation is performed, p-body 52, p-body pickup region 54, and source pickup regions 56 may be covered by a photo resist (not shown). Alternatively, source pickup regions 56 are also formed after the formation of opening 60, so that source pickup regions 56 and drain pickup region 62 may be formed simultaneously.

Figure 13A:
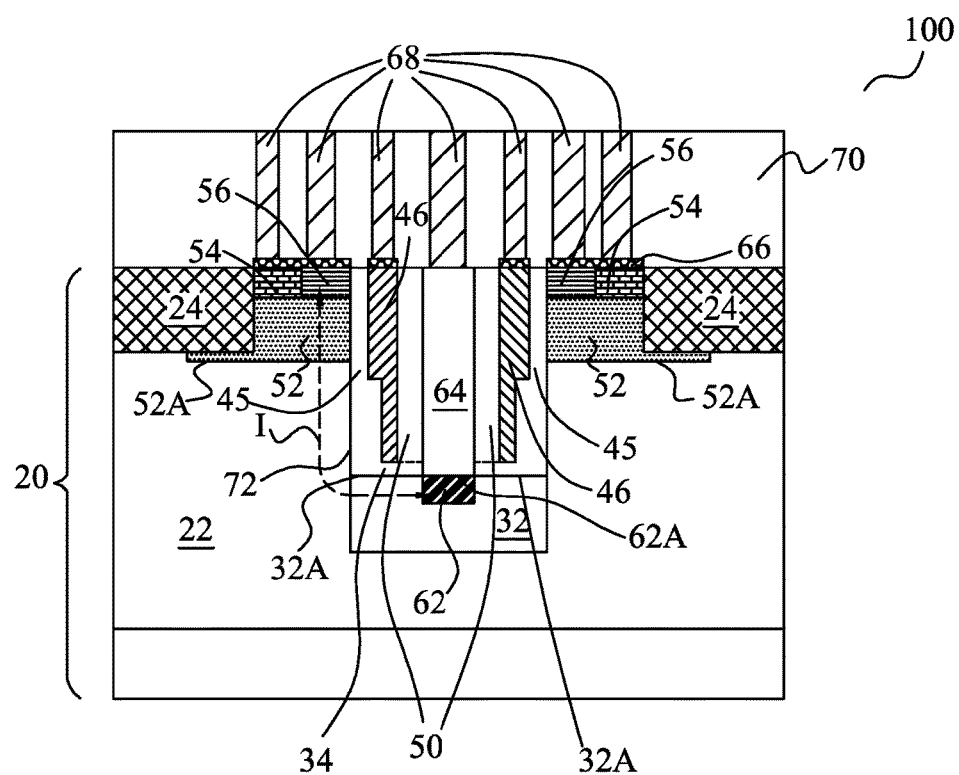

FIG. 13A illustrates the formation of the remaining portions of power MOSFET 100. In an embodiment, opening 60 is filled with a conductive material such as tungsten or a tungsten alloy, and the resulting plug is referred to as deep conductive plug 64, which is embedded in dielectric regions 50/34. The formation of deep conductive plug 64 may include filling the conductive material into opening 60, and performing a CMP to remove excess conductive material. FIG. 13A further illustrates the formation of the portions that are related to power MOSFET 100, which include silicide regions 66, contact plugs 68, and interlayer dielectric (ILD) 70.

In the resulting power MOSFET 100, DDD region 32 and drain pickup region 62 are buried deep in well region 22/substrate 20, and top surface 32A of DDD region 32 and top surface 62A of drain pickup region 62 are lower than the top surfaces and the bottom surfaces of p-body pickup region 54 and source pickup regions 56. Furthermore, top surface 32A of DDD region 32 and top surface 62A of drain pickup region 62 are also lower than the top surfaces (which are the interfaces between p-body 52 and overlying regions 54 and 56) and bottom surface 52A of p-body 52. Accordingly, a significant part of source-drain current I that flows between source pickup regions 56 and drain pickup region 62 is in a vertical direction that is perpendicular to surface 20A (FIG. 1) of substrate 20. Furthermore, drain pickup region 62 is connected to the deep conductive plug 64 that is formed below the top surface of well region 22 (substrate 20). Deep conductive plug 64 is further located below and connected to contact plug 68, which is formed above the top surface of substrate 20.

Figure 13B:
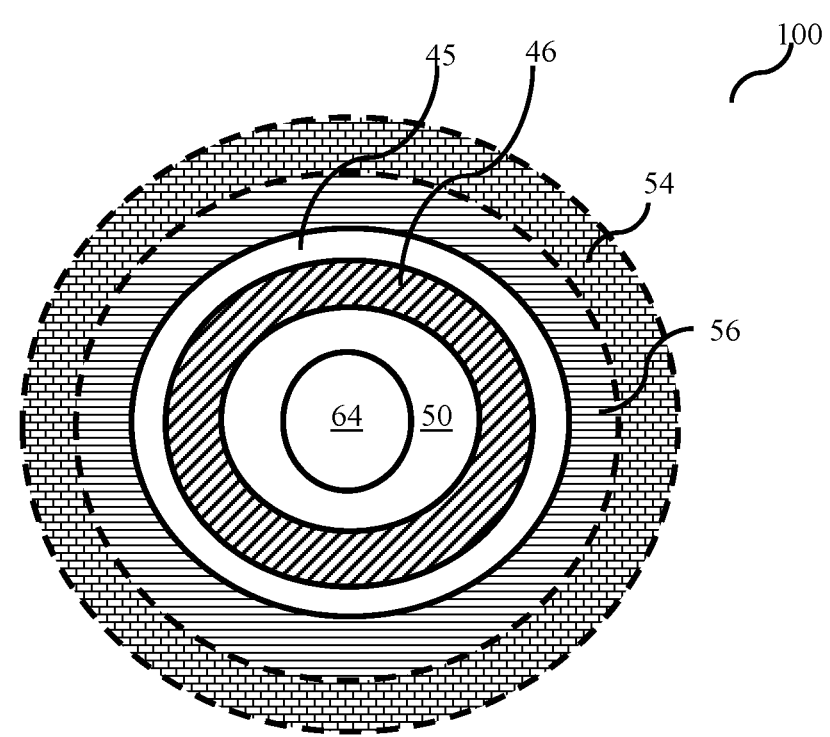
FIG. 13B is a top down view of a portion of the MOSFET of FIG. 13A.

Gate oxide 45 extends in the vertical direction, and the portion of well region 22 that is between DDD region 32 and p-body 52 also forms interface 72 with oxide region 34, wherein interface 72 also extends in the vertical direction. Each of p-body 52 and source pickup regions 56 comprises portions on opposite sides of trench 30, and on opposite sides of deep conductive plug 64. In an embodiment in which power MOSFET 100 has a single-trench structure including a single drain, FIG. 13B illustrates that in a top down view of substrate 20 at a central portion of FIG. 13A, gate electrode 46 may form a ring encircling deep conductive plug 64, while each of source pickup regions 56, p-body 52, and p-body pickup region 54 may, or may not, form a ring encircling deep conductive plug 64.

Figure 14:
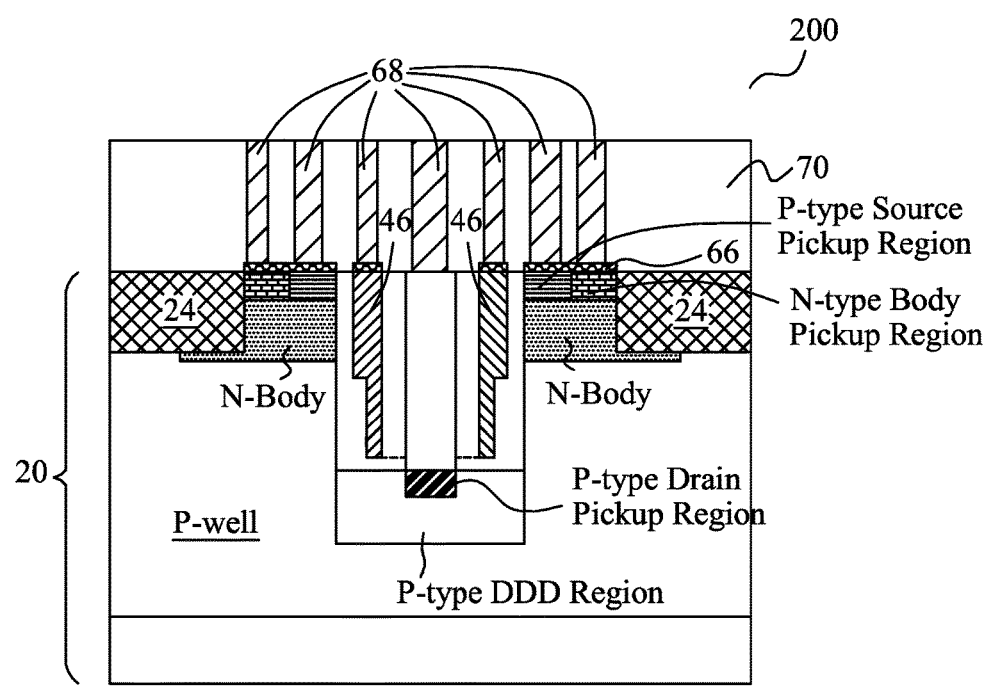
FIG. 14 illustrates a cross-sectional view of a p-type power MOSFET.

Although the embodiments shown in FIGS. 1 through 13A provide a method of forming n-type power MOSFETs, one skilled in the art will realize that the provided teaching is readily available for the formation of p-type power MOSFETs, with the conductivity types of the respective regions 22, 32, 52, 54, 56, and 62 inverted. FIG. 14 illustrates p-type power MOSFET 200, wherein the respective regions are marked. The formation process of p-type power MOSFET 200 may be essentially the same as shown in FIGS. 1 through 13A.

By using the embodiments, the resulting power MOSFETs 100 (FIG. 13A) and 200 (FIG. 14) are quasi-vertical MOSFETs with vertical gate oxides and vertical gate electrodes. Therefore, the cell pitch is significantly reduced, and the density of the power MOSFETs can be increased without sacrificing the corresponding breakdown voltage BVdss and on-resistance Ron.

In accordance with embodiments, a MOSFET includes a semiconductor substrate having a top surface, a body region of a first conductivity type in the semiconductor substrate, and a double diffused drain (DDD) region having a top surface lower than a bottom surface of the body region. The DDD region is of a second conductivity type opposite the first conductivity type. The MOSFET further includes a gate oxide, and a gate electrode separated from the body region by the gate oxide. A portion of the gate oxide and a portion of the gate electrode are below the top surface of the body region.

In accordance with other embodiments, a MOSFET includes a trench extending from a top surface of a semiconductor substrate into the semiconductor substrate. A gate electrode extends downwardly from the top surface of a semiconductor substrate, wherein the gate electrode is located in the trench. A body region is in the semiconductor substrate, wherein the body region is of a first conductivity type. A gate oxide is located between the body region and an upper portion of the gate electrode, wherein the gate oxide is disposed vertically in a direction perpendicular to the top surface of the semiconductor substrate. A DDD region of a second conductivity type opposite the first conductivity type is lower than the body region.

In accordance with yet other embodiments, a method includes forming a trench extending from a top surface of a semiconductor substrate into the semiconductor substrate, and forming a DDD region of a first conductivity type in the semiconductor substrate and under the trench. A first oxide region is formed in the trench, wherein the first oxide region includes a bottom portion at a bottom of the trench and a sidewall portion at a sidewall of the trench. The sidewall portion has a top end lower than the top surface of the semiconductor substrate. A gate oxide is formed to extend from the top surface of the semiconductor substrate down to the top end of the sidewall portion of the first oxide region. A gate electrode is formed on a sidewall of the gate oxide and a sidewall of the sidewall portion of the first oxide region. A body region is formed adjacent the top surface of the semiconductor substrate, wherein the body region is of a second conductivity type opposite the first conductivity type.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
  a metal-oxide-semiconductor field-effect transistor (MOSFET) comprising:
    a semiconductor substrate comprising a top surface;
    a well of a first conductivity type in the semiconductor substrate, wherein a top surface of the well is the top surface of the semiconductor substrate;
    a conductive plug extending into the well;
    a body region of a second conductivity type in the well, wherein the second conductivity type is opposite the first conductivity type;
    a double diffused drain (DDD) region having a top surface lower than a bottom surface of the body region, wherein the DDD region is of the first conductivity type;
    a dielectric ring encircling, and in contact with, the conductive plug;
    a gate electrode encircling and in contact with the dielectric ring, wherein a top surface of the DDD region is lower than a bottom end of the gate electrode, wherein the gate electrode comprises:
      a first edge contacting the dielectric ring and facing the conductive plug, the first edge extends continuously in a straight line from the top surface of the semiconductor substrate to a bottommost surface of the gate electrode; and
      a second edge and a third edge opposite the first edge, wherein a first distance between the second edge and the first edge is greater than a second distance between the third edge and the first edge, the first distance and the second distance are measured along lines parallel to the top surface of the semiconductor substrate;
    a gate oxide encircling and in contact with the gate electrode, wherein a first vertical edge of the gate oxide is aligned with and abutting a second vertical edge of the DDD region, with the first and the second vertical edges being perpendicular to the top surface of the semiconductor substrate, the first vertical edge being an outermost edge of the gate oxide and the second vertical edge being an outermost edge of the DDD region, and wherein a portion of the gate oxide and a portion of the gate electrode are below a top surface of the body region; and
    a source pickup region of the first conductivity type encircling the gate oxide.

2. The device of claim 1, wherein a bottom end of the gate oxide is lower than the bottom surface of the body region.

3. The device of claim 1, wherein the gate electrode comprises an upper portion and a lower portion under the upper portion, wherein the upper portion is laterally spaced apart from a nearest portion of the body region by a first spacing equal to a thickness of the gate oxide, and wherein the lower portion is laterally spaced apart from a nearest portion of the semiconductor substrate by a second spacing greater than the first spacing.

4. The device of claim 1, wherein the gate electrode comprises two parts that are at a same level as a portion of the conductive plug, and wherein the two parts are on opposite sides of the conductive plug.

5. The device of claim 1 further comprising:
  a body pickup region of the first conductivity type, wherein the source pickup region and the body pickup region extend from substantially the top surface of the semiconductor substrate into the semiconductor substrate.

6. The device of claim 1, wherein the gate oxide and the gate electrode form rings, and wherein the conductive plug is at a center of the rings.

7. The device of claim 1, wherein the DDD region comprises first outermost sidewalls, wherein the gate oxide comprises second outermost sidewalls, with each of the first outermost sidewalls and a respective one of the second outermost sidewalls aligned to a same vertical line.

8. The device of claim 1, wherein the first vertical edge of the gate oxide is an outer edge, and the gate oxide further comprises an inner edge opposite to and encircled by the outer edge.

9. The device of claim 1, wherein the first vertical edge extends from and is collinear with the second vertical edge.

10. The device of claim 1, wherein the body region comprises an extension contacting a portion of a bottom edge of an STI region.

11. The device of claim 1 further comprising a drain pickup region in the DDD region, the drain pickup region being a heavily doped region.

12. A device comprising:
a metal-oxide-semiconductor field-effect transistor (MOSFET) comprising:
   a trench extending from a top surface of a semiconductor substrate into the semiconductor substrate;
   a gate electrode extending downwardly from the top surface of the semiconductor substrate, wherein the gate electrode is located in the trench;
   a body region in the semiconductor substrate, wherein the body region is of a first conductivity type;
   a gate oxide between the body region and an upper portion of the gate electrode, wherein the gate oxide is disposed vertically in a direction perpendicular to the top surface of the semiconductor substrate; and
   a double diffused drain (DDD) region of a second conductivity type opposite the first conductivity type, wherein the DDD region is lower than the body region;
a conductive plug extending from a top end of the trench down to the DDD region, wherein the gate oxide and the gate electrode form rings, with the conductive plug being located at a center of the rings;
a dielectric layer encircling the conductive plug and disposed between the conductive plug and the gate electrode, wherein the gate electrode comprises a first edge contacting an edge of the dielectric layer and facing the conductive plug, and a second edge and a third edge opposite the first edge, wherein a first distance between the second edge and the first edge is greater than a second distance between the third edge and the first edge, the first distance and the second distance are measured along lines parallel to the top surface of the semiconductor substrate, the first edge extends continuously in a straight line from the top surface of the semiconductor substrate to a bottom of the gate electrode; and
a source pickup region of the second conductivity type encircling the gate oxide.

13. The device of claim 12, wherein the gate oxide has a first thickness, and wherein the gate electrode further comprises a lower portion, and wherein the lower portion is laterally spaced apart from a nearest portion of the semiconductor substrate by a dielectric region having a second thickness greater than the first thickness.

14. The device of claim 12, wherein the gate electrode comprises two parts that are at a same level as a portion of the conductive plug, and wherein the two parts are on opposite sides of the conductive plug.

15. The device of claim 12 further comprising a drain pickup region of the second conductivity type in the DDD region, wherein the drain pickup region is directly underlying and electrically coupled to the conductive plug, wherein a topmost surface of the drain pickup region is level with a topmost surface of the DDD region, and wherein the topmost surface of the drain pickup region and the topmost surface of the DDD region are parallel to the top surface of the semiconductor substrate.

16. The device of claim 12, wherein the DDD region comprises first opposite sidewalls, wherein the gate oxide comprises second opposite sidewalls, with each of the first opposite sidewalls and a respective one of the second opposite sidewalls aligned to a same vertical line.

17. The device of claim 12, wherein the first edge of the gate electrode is a continuous vertical edge with no break therein, and the second edge and the third edge are coplanar with an upper portion and a lower portion, respectively, of the first edge.

18. The device of claim 12, wherein first vertical interface between the gate oxide and the semiconductor substrate is aligned with and abuts a second vertical interface between the DDD region and the semiconductor substrate, and wherein the first vertical interface and the second vertical interface are perpendicular to the top surface of the semiconductor substrate.

19. A device comprising:
a metal-oxide-semiconductor field-effect transistor (MOSFET) comprising:
   a trench extending from a top surface of a semiconductor substrate into the semiconductor substrate, a top end of the trench being coplanar with the top surface of the semiconductor substrate;
   a gate electrode extending from the top end of the trench into the trench;
   a shallow trench isolation (STI) region in the semiconductor substrate;
   a body region in the semiconductor substrate, the body region being of a first conductivity type, the body region being disposed between the STI and the trench, and the body region comprising an extension contacting a portion of a bottom surface of the STI;
   a gate oxide between the body region and the gate electrode, the gate oxide being disposed within the trench; and
   a double diffused drain (DDD) region of a second conductivity type opposite the first conductivity type, the DDD region disposed at a bottom end of the trench such that the DDD region is lower than the body region, the bottom end of the trench being opposite the top end of the trench, a first vertical edge of the DDD region being aligned with and abutting a second vertical edge of the gate oxide, the first and second vertical edges being perpendicular to the top surface of the semiconductor substrate;
   a conductive plug extending from a top end of the trench down to the DDD region, wherein the gate oxide and the gate electrode form concentric rings, with the conductive plug being located at a center of the rings, and wherein the gate electrode comprises a first edge facing the conductive plug, a second edge and a third edge opposite the first edge, the second edge extending vertically within the trench from the top end of the trench to a first depth, the third edge extending vertically within the trench from the first depth to a second depth deeper than the first depth, the first edge extending in a straight line from the top end of the trench to the second depth, the second edge and the third edge being offset horizontally such that a distance between the second edge and the first edge is greater than a distance between the third edge and the first edge;
a drain pickup region of the second conductivity type disposed in the DDD such that the drain pickup region contacts a bottom edge of the conductive plug;
a dielectric layer encircling the conductive plug; and
a source pickup region of the second conductivity type encircling the gate oxide.

20. The device of claim 19, wherein the first vertical edge is an outermost edge of the gate oxide and the second vertical edge is an outermost edge of the DDD region.

\* \* \* \* \*